United States Patent [19]

Kemmer et al.

[11] Patent Number: 4,885,620
[45] Date of Patent: Dec. 5, 1989

[54] SEMICONDUCTOR ELEMENT

[76] Inventors: Josef Kemmer, Hauptstr. 41 D, 8048 Haimhausen; Gerhard Lutz, Therese-Giese-Allee 23, 8000 Munchen 83, both of Fed. Rep. of Germany

[21] Appl. No.: 828,322

[22] PCT Filed: Apr. 25, 1985

[86] PCT No.: PCT/DE85/00133
§ 371 Date: Feb. 24, 1986
§ 102(e) Date: Feb. 24, 1986

[87] PCT Pub. No.: WO85/04986
PCT Pub. Date: Nov. 7, 1985

[30] Foreign Application Priority Data

Apr. 25, 1984 [DE] Fed. Rep. of Germany ....... 3415426
Apr. 25, 1984 [DE] Fed. Rep. of Germany ....... 3415443
May 19, 1984 [DE] Fed. Rep. of Germany ....... 3418778
Jul. 25, 1984 [DE] Fed. Rep. of Germany ....... 3427476

[51] Int. Cl.$^4$ .................... H01L 27/14; H01L 31/00
[52] U.S. Cl. ........................................ 357/24; 357/30; 357/29; 250/330; 250/372; 250/370.01; 250/370.08
[58] Field of Search ............... 357/24 LR:30 R, 301 I, 357/301 C., 29; 250/330, 332, 334, 370, 372

[56] References Cited

U.S. PATENT DOCUMENTS

| | | | |
|---|---|---|---|
| 3,858,232 | 12/1974 | Boyle et al. | 357/24 |
| 3,906,543 | 9/1975 | Smith et al. | 357/24 |
| 4,482,807 | 11/1984 | Blackburn et al. | 357/30 X |
| 4,571,626 | 2/1986 | Yamada | 357/24 X |
| 4,684,969 | 8/1987 | Taguchi | 357/30 |
| 4,729,005 | 3/1988 | Hei et al. | 357/30 |
| 4,801,802 | 1/1989 | Dyson | 250/330 |

OTHER PUBLICATIONS

Gatti et al., "Semiconductor Drift Chamber-An Application of a Novel Charge Transport Scheme", presented at 2nd PISA Meeting on Advanced Detectors, Italy, Jun. 3-7, 1983.
Heyns et al., "Image Sensor with Resistive Electrodes", Phillips Tech Review, vol. 37, No. 11/12, 1977, pp. 303-311.

Primary Examiner—Thomas H. Tarcza
Assistant Examiner—John B. Sotomayor
Attorney, Agent, or Firm—Barnes & Thornburg

[57] ABSTRACT

A semiconductor element with a basic region, to which a bias voltage is applied from at least one boundary surface and which completely depletes the basic region of majority carriers and produces a potential minimum in the basic region for the majoity carriers, in which the latter are collected and moved.

On at least one side of the potential minimum, the quantity, movement direction and/or speed of the minority carriers is controlled by the course of the potential minimum.

40 Claims, 10 Drawing Sheets

SEMICONDUCTOR ELEMENT

DESCRIPTION

1. Technical Field

The invention relates to a semiconductor element and in particular to a semiconductor element which may be used for such purposes as detecting particles or radiation.

2. Background Art

A semiconductor element designed for the specific use as a semiconductor detector is disclosed in publication 33523 of the Brookhaven National Laboratory, August 1983. In the case of this known detector, which is also known as a semiconductor drift chamber, the position of the incident particles in an electric transverse field can be determined by means of the drift time of the majority carriers. In the publication, the minority carriers are the electrons in an n-doped semiconductor body. This publication also describes various modifications to the semiconductor detector. According to one modification, the semiconductor detector can be used as a CCD for the majority carriers.

In the known semiconductor detector, the semiconductor body is completely depleted of the majority carriers by the bias applied from both main surfaces, so that there is a potential minium for the majority carriers within the body. The majority carriers are collected and moved in this potential minimum. However, no attention is paid to the minority carriers. It is an object of the present invention to utilize the movement of minority carriers as well as majority carriers.

DISCLOSURE OF THE INVENTION

The present invention has recognized that the existence of the potential minimum for the majority carriers, which simultaneously represents a potential maximum for the minority carriers, permits a planned influencing of the quantity, movement direction and/or speed of the minority carriers. This leads to a number of additional possible uses for the semiconductor elements according to the invention.

As a result of the configuration of each of the potential maxima for the minority carriers, the basic region of a semiconductor element is subdivided into a plurality of parts on either side which are independent for purposes of the minority carriers. Among other uses, this makes it possible to simulate an epitaxial layer with a comparatively thick semiconductor body and a potential maximum positioned closely below one main semiconductor surface in which there are further regions which form the electronic elements. Thus it is possible with a comparatively thick basic body to achieve the advantages of an epitaxial layer with respect to the cutoff frequency, reverse currents, etc.

As a result of a special geometrical configuration, it is also possible to produce several potential maxima, by means of a sandwich construction in a basic region in which the p and n-doped regions alternate. It is also possible to use a cylindrical configuration, in which the potential maximum is located in the cylinder axis.

Particularly if the semiconductor element according to the invention is used as a detector for particles and/or radiation such as γ and x-radiation, but also for detecting radiation with wavelengths from the UV to the infrared, it is advantageous that a minority carrier signal be produced on each main surface by subdividing the semiconductor body into at least two parts which are independent for purposes of the minority carriers. Thus, each main surface is supplied by minority carriers formed in different parts of the semiconductor body which can then be further processed in different ways. For example, the minority carrier signal at the main surface of the semiconductor body can be used as a trigger signal for determining majority carrier transit time. In addition, the minority carrier signals can be used for determining the position and/or energy and range of the incident radiation. It is possible to readout the minority carrier signal "rapidly" or to use the semiconductor detector the as a charge-coupled device for the minority carrier signals.

The direction of movement and/or the speed of the minority carriers can also be influenced by the path of the potential beneath the main surfaces. The path of the potential can also be influenced by doping of the basic region in the area of at least one main surface. For example, the electrode design on one or both of the main surfaces may be arranged in one of a number of possibilities.

It is possible invention to readout the minority carrier signals from only one of the regions separated by potential maxima, or from many or all of the separate regions.

It is also possible to evaluate the majority carrier signal which is produced by the majority carriers formed in the complete body and collected in the potential minimum. At least one collector electrode for the majority carriers must be provided.

An electrode design having a SiO insulating layer to which is applied a conductive layer with a defined surface resistance is particularly advantageous. As a result of the RIS structure a structure in which (i.e., an insulating layer on at least one main surface carries a conductive layer, such as a resistance layer or a low-impedance layer,) not only is the outflow of minority carriers into the regions of the main surfaces prevented, but it is also possible to produce a potential which is "curved" against the main surfaces. In the limiting case, such a RIS structure can be a MOS structure if the top layer is of a low-impedance nature.

This electrode construction also makes it possible to produce a continuous CCD in which the displacement of the minority carriers which have flown to the main surface takes place continuously. Such a CCD has the advantage that there is no need to erase the individual cells.

The present invention makes it possible to construct an electrode arrangement which is a depletion layer formed by pn-junctions, Schottky junctions or heterogeneous structures.

In a further development of the invention, at least one of the depletion layers used as the electrode arrangement is constructed in a large-area and low-impedance manner. This leads to a rapid trigger signal and in addition the photolithography used in production is simplified through the large-area region.

Electrode arrangements having a plurality of separate depletion layers and/or RIS structures have the advantage that through suitable bias voltages applied to the electrode arrangements a clearly defined transverse potential gradient can be produced. The same is true for a semiconductor surface having individual regions arranged in a matrix or strip-like manner. It is also possible to apply a second voltage to one region of the second conductivity type which exceeds by a multiple a breakdown voltage of the pn-junction. Thus, a voltage is obtained in the adjacent regions which decreases in each case by the breakdown voltage from one region to the next. Thus, as described in a earlierdated patent application German No. P 34 09 163.7, it is possible to set a precisely defined, transverse electric field in the semiconductor body with limited external circuitry.

The strip-like or matrix-like regions of a semiconductor surface permit a position resolution. With strip-like regions, it is also possible to connect the regions by implanted "cross-strips" and in this way to build up an integrated voltage divider.

The external circuitry required for building up a transverse field can also be simplified in that a region of a second conductivity type on at least one of the two main surfaces may be a large-area, highimpedance region and the voltage drop in the transverse direction occuring in this region will produce the desired transverse electric field. This arrangement has the advantage that the adjustment expenditure during production is much less than in an arrangement where there is a plurality of separate regions on both main surfaces.

The semiconductor detector, particularly if it is operated as a CCD semiconductor detector for the majority carriers, has a number of advantages over prior art detectors.

For example, the minority carrier signal can be read out without delay so that in addition to the CCD signal a rapid signal is available to the majority carriers. This signal can be used as a trigger signal.

A strip-like or matrix-like construction of the electrodes on the other main surface also permits a position resolution of the signal produced by the minority carriers in the direction of the main surface.

This permits an association of the slow readout CCD signals with the fast minority carrier signals, which permits partial reading (i.e., the skipping of "empty" CCD cells) so that the readout speed can be drastically increased. It is also possible to eliminate signals of "undesired" events during the readout time.

The CCD semiconductor component has the advantage that the fully depleted volume gives large signals for traversing particles or radiation and the signals are still stored close to the surface.

The strip-like or matrix-like structure on one of the two main surfaces can be a RIS structure, particularly a MOS (metal-oxide semiconductor) structure or a "bipolar" structure. That is, the structure can comprise pn-junctions or it is also possible to use Schottky junctions, heterogeneous junctions.

The use of a RIS or MOS structure has the advantage that the semiconductor component according to the invention can be operated as a CCD both for the majority carriers and for the minority carriers. As a result, two "charge images" are obtained. The "charge images" of the majority carriers is brought about by the majority carriers produced in the entire semiconductor body, while the "charge images" of the minority carriers is produced only by the minority carriers formed by the incident radiation between the main surface with the RIS structure and the potential minimum for the majority carriers. Thus, a comparison of the two "charge images" permits a discrimination between different penetration depths. If the CCD is used as a detector for visible light and infrared radiation, and the radiation enters through the main surface on which the RIS structure is located, the charge image of the majority carriers will produce the image produced by the visible light and the infrared light, while the charge image of the minority carriers will only reproduce the image produced by the visible light.

The application of a minority carrier-CCD structure to the other main surface also makes it possible to read out a third charge image since the minority carrier image obtained therefrom will supply an infrared image.

By using an electrode arrangement with strips of a conductivity type different from that of the semiconductor body, at right angles to which are strips with the same conductivity as the semiconductor body preferred shift directions in the charge-coupled devices are obtained.

It is also possible to arrange MIS and bipolar structures in alternating manner, displaced in the direction of the normal of the main surface, so that the CCD cells can be very densely packed together. This arrangement is technologically very easy to produce. The semiconductor element according to the invention also makes it possible in a very simple manner to intergrate electronic structures into the semiconductor body. Possible uses of the semiconductor elements according to the invention are discussed below.

BEST MODE FOR CARRING OUT THE INVENTION

With the embodiments described in exemplified manner hereinafter for the application as a semiconductor detector, it is intended to show that through the combination of different electrode structures based on the same basic principle the different semiconductor elements can be utilized for different purposes.

In the drawings described hereinafter k is in each case a semiconductor body having two main surfaces 1 and 2 and while being in no way restrictive, is made from high-impedance, homogeneous, n-doped silicon. The regions of a second conductivity type provided in the main surfaces are p-regions and are designated p1, p2, etc.

Figure 1:
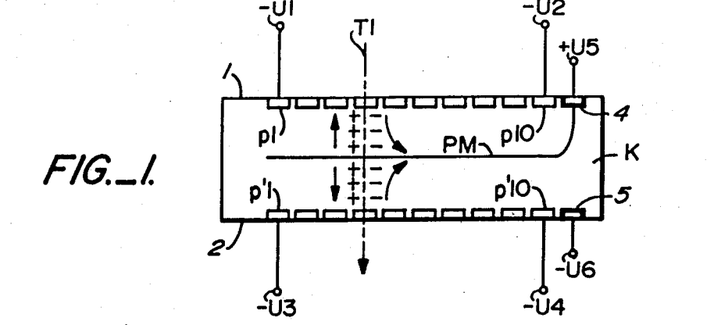
FIG. 1 is a cross-section view through a semiconductor body in accord with a first embodiment of the invention.

FIG. 1 shows a cross-section through a semiconductor detector according to the invention. On the main surface 1 are provided numerous p-regions p1 ... p10, while on the main surface 2 there are numerous p-regions p'1, p'2, etc. On the main surface 1 there is also a n+ region 4 and on the main surface 2 is a p-doped counter-electrode 5, to which is applied a voltage $-U_6$ which "smoothes" the potential distribution.

Voltages $-U1$, $-U2$, $-U3$ and $-U4$ are applied to electrodes on the p-regions p1, p10, p'1, p'10. The size of the voltages is made such that on the one hand a transverse electric field is built up and on the other the semiconductor body is completely depleted of majority carriers i.e., electrons. The following relationship applies:

$$|U1|>|U2|, |U3|>|U4|$$

The electrons are then collected in a potential minimum, represented by a line PM, in the center of the semiconductor body.

In the represented embodiment U1=U3 and U2=U4 (=0V), so that the potential minimum is in the center of the semiconductor body.

An incident, ionizing particle T1 produces electron/hole pairs designated by + and − symbols in the semiconductor body. The electrons drift along the potential minimum PM to the n+ region 4. A voltage +U5 is applied to the region 4 so that the region acts as an anode. The minority carriers, (i.e., the holes) pass to the p-contacts, where they can be used for releasing a trigger signal for the electron transit time.

In the case of the semiconductor detector shown in FIG. 1, a restriction applies which will be discussed more fully with reference to FIGS. 3 and 4. At the electrodes on which the p+ regions are applied, initially a signal opposite to the signal produced by the holes is influenced by electrons and can even compensate the signal produced by the holes. Nevertheless, a trigger signal can be tapped by evaluating the signal shape.

Figure 2:
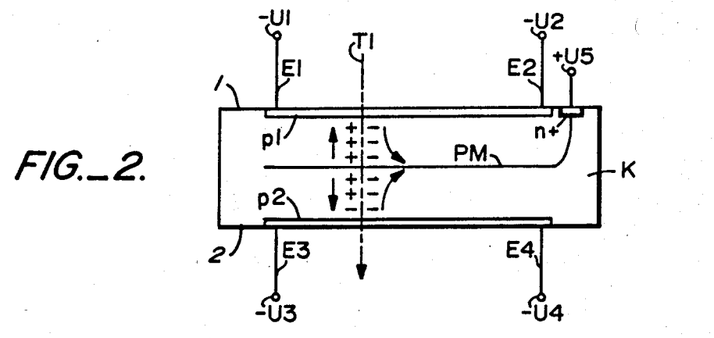
FIG. 2 is a cross-section view through a semiconductor today in accord with a second embodiment of the invention.

FIG. 2 shows another embodiment of a semiconductor detector, which also has a n-silicon semiconductor body k with two main surfaces 1 and 2. However, to these main surfaces are not applied separate strip-like or ring-like p+ regions which are spaced from one another. In fact on each main surface there is a large-area p-region p1 or p2 which is produced in a comparatively high-impedance manner according to a known implantation process and which can therefore serve as the resistance layer. To facing points of regions p1 or p2 are applied electrodes E1, E2 or E3, E4, to which are applied voltages $-U1$, $-U2$, $-U3$ or $-U4$, which fulfil the relationship $|U1>|U2, |U3>|U4$. A voltage U5 is applied to a n+ region in the main surface 1.

The semiconductor detector according to FIG. 2 not only has the advantage that the comparatively complicated electrode structures on the two main surfaces can be replaced by large-area regions and consequently adjustment during manufacture is simplified, but also the advantage that the location of the radiation initiating the production of electron/hole pairs can be roughly determined by the ratio of the signals produced by the holes at electrodes E1 and E2 or E3 and this location determination is E4 apart from determining the location of radiation on the basis of the electron drift time. It is therefore possible to increase the count rate of the detector, because in the case of two briefly succeeding particles striking different locations an association of the trigger signals is possible. It is also possible to provide more than two electrodes in regions p1 or p2 in order to achieve a two-dimensional position measurement.

Moreover, both in the cases of the embodiment of FIG. 1 and that of FIG. 2, from the signals produced by the holes, it is also possible to determine the energy of the incident particles since the energy corresponds to the quantity of charges procduced.

Figure 3A:
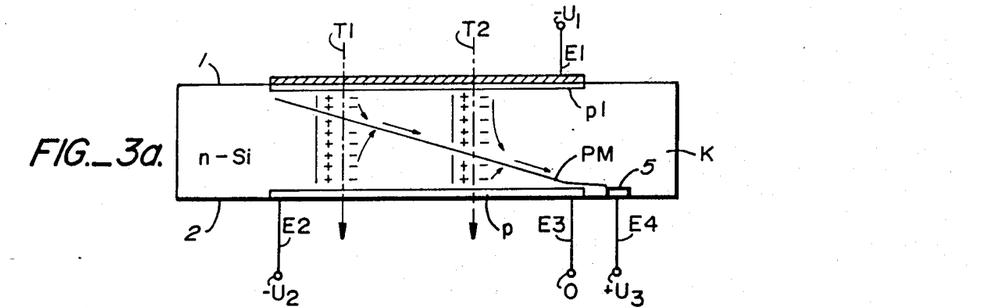
FIGS. 3a and 3b are cross-section views through semiconductor bodies in accord with a third embodiment of the invention.
Figure 3B:
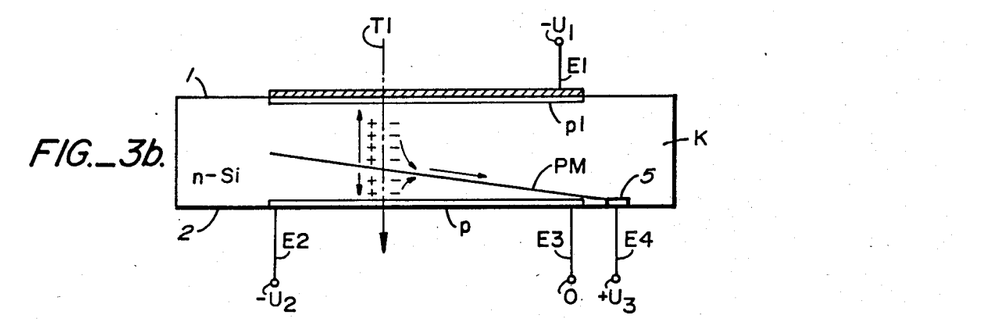

FIGS. 3a and 3b show a further embodiment of a semiconductor detector according to the invention. Unlike the case of the embodiments shown in FIGS. 1 and 2, in this embodiment steps are only taken on one main surface 2 of semiconductor body k to produce a potential gradient. On main surface 1 of semiconductor body k there is a large-area p-region p1, to which is applied a layer of high conductive material (e.g., aluminum or ITO (indium-tin oxide) in the case of optical detectors which serves as the electrode. On the other main surface 2 of the semiconductor body there is a structure producing a transverse electric field. In the case of the represented embodiment, as in the embodiment of FIG. 2, this structure is a p-region with a clearly defined surface resistance.

In the main surface 2, there is also a n+ region 5, to which is applied an electrode E4. If the voltages $-U1$, $-U2$, $-U3=0$ and $+U4$ are applied to electrodes E1, E2, E3 and respectively, with $-U3=0$, a E4 potential minimum PM, shown in FIG. 3, is obtained which runs from the main surface 1 to the n+ region. As a result of this potential minimum PM, the semiconductor body k is subdivided into two wedge-shaped regions, which are independent for purpose of the minority carriers (holes). The incidence point and the energy from a particle producing along its path a constant electrode/hole density and traversing the detector, can be determined in different ways. Use is hereby made of the fact that the proportion of the minority carriers migrating to the upper or lower electrodes is dependent on the position of the potential minimum. A particle T1 passing through the detector shown in FIG. 3a produces few holes in the upper part, but many holes in the lower part, the opposite being the case for particle T2.

It is, therefore, possible to determine the position of the particle from the signal ratio of the holes in both semiconductor parts. However, position determination is made more difficult by the fact that in the initial phase of charge drift, the signals caused by the holes are superimposed by influence signals of the electrons, which migrate to the potential minimum. The influence of the electrons on the signals caused by the holes at the p-electrodes E1, E2 and E3 is naturally dependent on the distance of the electron cloud, (i.e., the potential minimum of the two electrodes). Only when the electrons have reached the anode, (i.e., electrode E4) has the influence disappeared. It is therefore more desirable to instead evaluate the modification of the signal shape at electrodes E1, E2 and E3 for position determination purposes.

In the position of the potential minimum PM shown in FIG. 3a, for the particle T1 the "influence signal" overcompensates the "hole signal" in the initial phase, but this is not the case with particle T2.

However, if by varying the voltages U1, U2 and U3, the distance of the potential minimum PM from the main surface 1 is increased (FIG. 3b), the rapid trigger signal at the electrode E1 produced by the holes will not be as strongly superimposed by the "influence signal" after the arrival of particle T1. Thus, a positive signal is obtained if the potential minimum passes below the geometrical center. The incidence point can be determined directly from the amplitude of this signal. As a result of this rough position determination via the minority carrier signal, it is possible to increase the detector count rate.

Another possibility of reducing the influence of the electrons comprises applying one electrode, (e.g., electrode E1) to the main surface 1 in the form of strips at right angles to the image plane. The influence on said cross-strips is reduced as the electrons migrate away from the particular strip.

On the other hand, by using strips parallel to the image plane (i.e., lengthwise strips) it is immediately possible to detect from the signal shape at the different strips which strip has been struck by the radiation. Thus a bi-dimensional position resolution is possible.

However, in both cases it is possible to tap a rapid trigger signal for the electrons on the low-impedance strip electrode. Further position information can be obtained from the "hole signal" tapped at electrodes E2 and E3. It is also possible to apply more than two electrodes to region p2, so that a bi-dimensional position resolution is possible.

Figure 4:
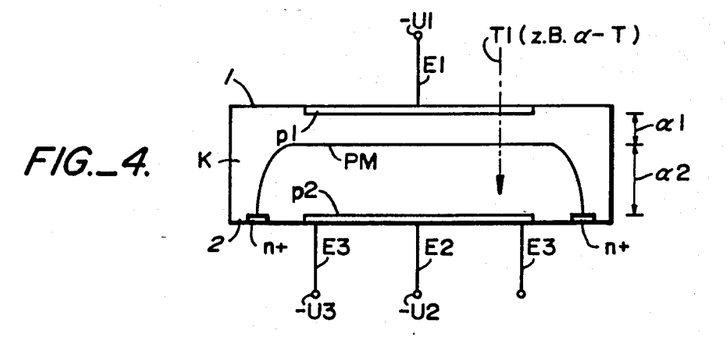
FIG. 4 is a cross-section view through a semi-conductor body in accord with a first embodiment of the invention used as a combined semiconductor detector.
Figure 5A:
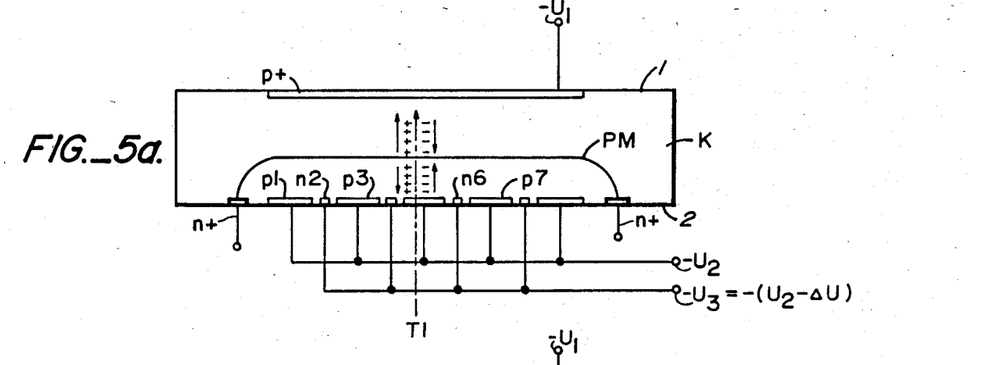
FIGS. 5a and b are cross-section views through semiconductor bodies in accord with a second embodiment of the invention used as a combined semiconductor detector.
Figure 5B:
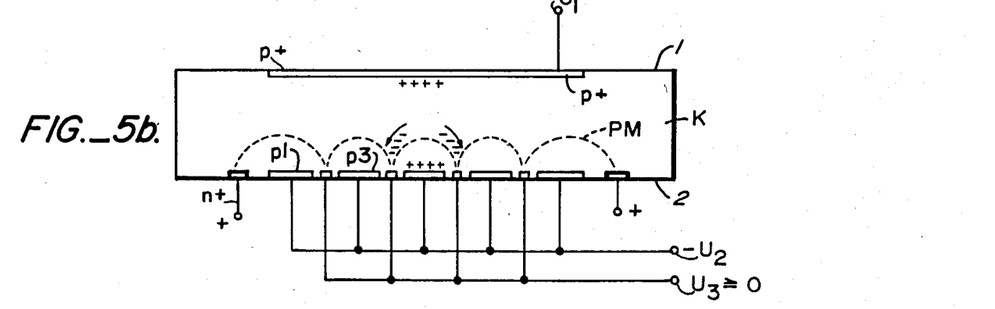

FIGS. 4 and 5 show further embodiments in the form of a combined semiconductor detector, (e.g., a dE/E detector, which can be used as a discriminator or as a spectral analyzer for light with wavelengths from UV to infrared. In the main surface 1, there is a large-area, low-impedance p-field p1 with an aluminum or ITO electrode E1. In the embodiment according to FIG. 4, in a second main surface 2 there is also a large-area p-field p2 which can be low-impedance or can be in the form of a resistance layer. The p-field p2 has at least two electrode connections E2 and E3 with E3 surrounding E2 in annular manner. In main surface 2, there is also an annular region n+ to which is applied the voltage $U_4$ ($\geq 0$).

It is to be assumed in the case of the embodiment according to FIG. 4 that the radiation enters through main surface 1. If a voltage $-U1$ is applied to electrode E1 and to electrode connections E2 and E3 are applied voltages $-U2$ and $-U3$, with the voltages being large enough for the space charge layers to be in contact, then a potential minimum PM is obtained for the majority carriers (the electrons in the case of the conductivity of the basic field selected in exemplified manner). In the case of homogeneous doping of the semiconductor body, with $-U2=-U3$, the potential minimum PM will pass through the geometrical center.

If the voltages $-U1$ and $-U2$ are chosen at different levels, then the potential minimum is not in the center of body k and is instead displaced towards the region subject to the lower voltage. In the represented embodiment, voltage U1 is smaller than voltage U2, so that the potential minimum is closer to region p1.

As a result of the two semiconductor regions which are independent for purposes of the minority carriers a condition which can otherwise only be produced by epitaxy or ion implantation (buried layer), it is possible to obtain in a simple manner a combined detector, such as a discriminator, a spectral analyzer, or, as in the embodiment shown in FIG. 1, a dE/E detector. The part of the semiconductor body k with the thickness d1 located between potential minimum PM and region p1 constitutes the dE detector, while the underlying part of body k with thickness d2 constitutes the E detector.

The thickness of the two regions or detectors can be set as desired by modifying the voltage ratios and the doping of the semiconductor body. The position of the potential minimum, and therefore the thicknesses d1 and d2, can be determined via the dark current of the holes in the absence of particles or radiation, there optionally being an additional exposure with an infrared light-emitting diode. Additionally, by subdividing electrode E3, (e.g., in the form of strips) a two-dimensional position resolution is possible.

If region p2 is in the form of a resistance layer, the ratio of the hole current tapped at electrode connection E2 as compared to E3 can be used for a rough determination of the point of incidence.

Hereinafter the function of the detector shown in FIG. 4 will be explained. If a particle strikes the main surface 1 of the dE/E detector, and the particle has a sufficiently large range, it will completely traverse the dE detector and will only be stopped in the E detector. The quantity of charges (holes) produced in the dE detector supplies the specific energy loss, while the charges (holes) in the E detector give the residual energy. It is therefore possible to simultaneously determine the energy and, via the specific energy loss, the nature of the particle. Furthermore, it is possible to obtain at least rough information as to the location of the incident particle. It is possible to simply vary the dE detector thickness as a function of the intended use.

The detector shown in FIG. 4 has an advantage over the prior art since no dead layers, comprising electrodes, are required between the dE detector and the detector for determining the residual energy.

The described detector and similarly constructed combined detectors have the advantage that the capacitance of the individual detectors is very low since it is not the thickness of the individual detector which is determinative of the size of the capacitance, but in addition the total thickness (d1+d2). The dE detector has low noise. Moreover, the reverse current of the dE detector is very small because the otherwise critical return contact is rendered superfluous. Finally, independent of the thickness, the detector is mechanically very stable.

However, in the form shown in FIG. 4 once again the signal influenced by the majority carriers (electrons) is superimposed on the minority carrier signal (hole signal) in the dE detector when the voltages are such there is a limited distance between the potential minimum and a main surface. It is therefore advantageous to take measures permitting an analysis of the signals (e.g., analysis of the signal shape) and/or to reduce the effect of the influence of collecting the electrons.

A complete rapid collection of the electrons is made possible since immediately after a particle has struck, thereby activating an internal trigger, the potential minimum is tilted by a reduction of the voltage U3. Thus, the electrons pass comparatively quickly along the potential minimum from the region of electrode E1 into the annular n+ region. After waiting the time necessary for the passing out of the electrons, the original state (U2=U3) is restored and the stored hole information is read out.

FIG. 5 shows another embodiment of the invention, in which the effect of the influence of the electrons is largely eliminated. In the embodiment of FIG. 5 it is to be assumed that the radiation enters through the main surface 2. In the main surface 2 there are alternate regions p1, n2, p3 etc., where are p or n-doped. The voltate U3 applied to regions n2, n4 etc. is slightly less negative than the voltage U2 which is applied to regions p1, p3, etc. U3=−(U2−dU). Through this reverse biasing of the pn-junction, injection of majority carriers (i.e., electrons is prevented (FIG. 5a).

For eliminating, that is for the rapid collection of the electrons in the potential minimum, voltage U3 is varied (− or voltages U3 and U2 are simultaneously varied) in the positive direction and/or voltage U1 is varied in the negative direction. Thus, the potential minimum is displaced in the direction of the n+ doped regions n2, n4, etc., so that the electrons in the potential minimum can flow into the n+ regions (FIG. 5b). The electron signal can be used for determining the total energy.

The electrons in the potential minimum can also be rapidly collected through temporaily modifying voltages U1, U2 and U3 in such a way that the space charge layers are no longer in contact, i.e. the potential minimum disappears and a thin n-layer is formed.

In a further operating mode, the concentration of the electrons in the potential minimum PM is increased by an additional exposure in such a way that a highly conductive coating is obtained, which separates the two parts of the semiconductor. However, this again leads to a higher capacity.

Figure 6:
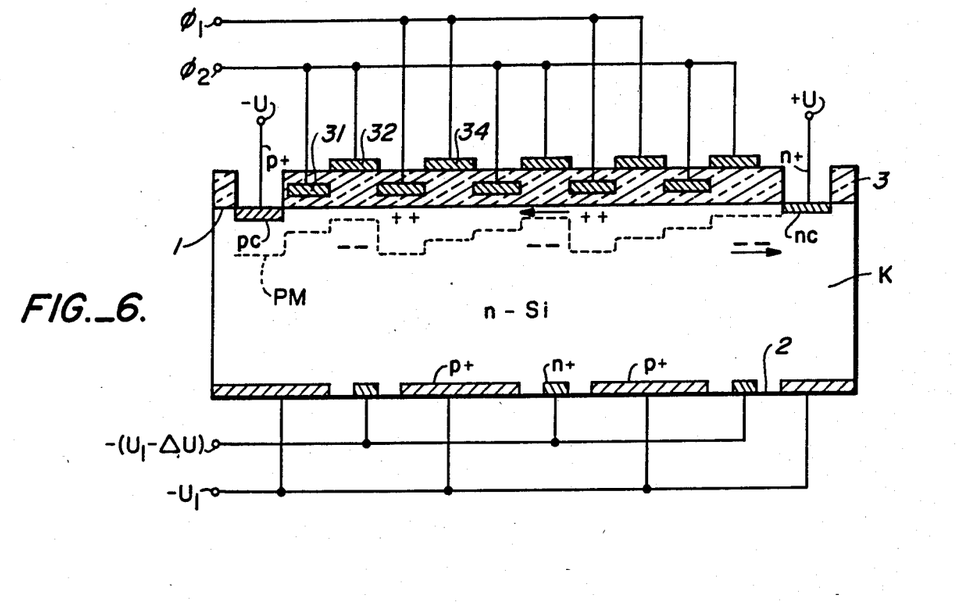
FIG. 6 is cross-section view through a semiconductor body in accord with first embodiment of the invention used as a CCD.

FIG. 6 shows a cross-section of a completely depleted CCD semiconductor component according to the invention. The CCD component once again has a N-conducting semiconductor body k, with a main surface 1 which carries a CCD structure. The main surface 2 carries an opposite electrode structure which permits a rapid readout of the minority carrier signals and the extinguishing of the two charge carrier modes in order to prevent "filling" of the CCD cells.

The CCD structure on the main surface 1 comprises, in r known manner, electrodes 31, 32, etc. in or on a surface oxide coating 3 (MOS electrodes) displaced in alternating manner in the direction of the surface normal. Cyclically varying voltages 01 and 02 are applied to electrodes 31, 32, etc. This permits a displacement of the majority carriers (electrons) and minority carriers (holes) in opposite direction to the reading electrodes ne or pe. Readout voltages +U or −U are applied to the reading electrodes ne and pe. A known buried channel arrangement can be used for increasing the transfer efficiency.

The cyclic variation of the voltages applied is known, so that there is no need to make more detailed reference thereto. However, unlike the known CCD components, the two-phase or polyphase variation of the voltage when applied to the present invention, permits the simultaneous displacement of both the majority carriers and the minority carriers in opposite directions to the readout electrodes ne or pe.

On the second main surface 2 of the semiconductor body k there is a strip-like structure which comprises alternate p+ and n+ doped regions. This structure firstly permits the complete depletion of body k with respect to majority carriers. Secondly the p+ regions permit the rapid readout of the minority carriers which are produced in that part of body k between the main surface 2 and the potential minimum for the majority carriers by incident radiation. The n+ regions arranged between the p+ regions permit the rapid collection of the stored majority carriers for deleting the CCD cells. For this purpose, normally the voltage −(U-dU) is slightly less negative than the voltage −U so that through this reverse bias of the pn-junction the injection of majority carriers is prevented. For the rapid collection of the electrons the voltage (−U-dU) is briefly raised to the value 0 or a value higher than 0 so that the electrons can flow into the n+ regions. It is otherwise possible to proceed in the manner described hereinbefore in conjunction with FIG. 5. The embodiment of FIG. 6 permits the recording of two charge images. If the element according to FIG. 6 is used as a detector for visible and infrared light, then the minority carrier charge image caused solely by the minority carriers produced in the region between the main surface 1 and the PM gives the "visible image" because the penetration depth of light with wavelengths in the visible range is smaller than that of light with wavelengths in the infrared range. On the other hand the majority carrier charge image caused by the majority carriers produced in the complete body k reproduces the "mixed image" of light with wavelengths from the infrared range to the visible range.

Figure 7:
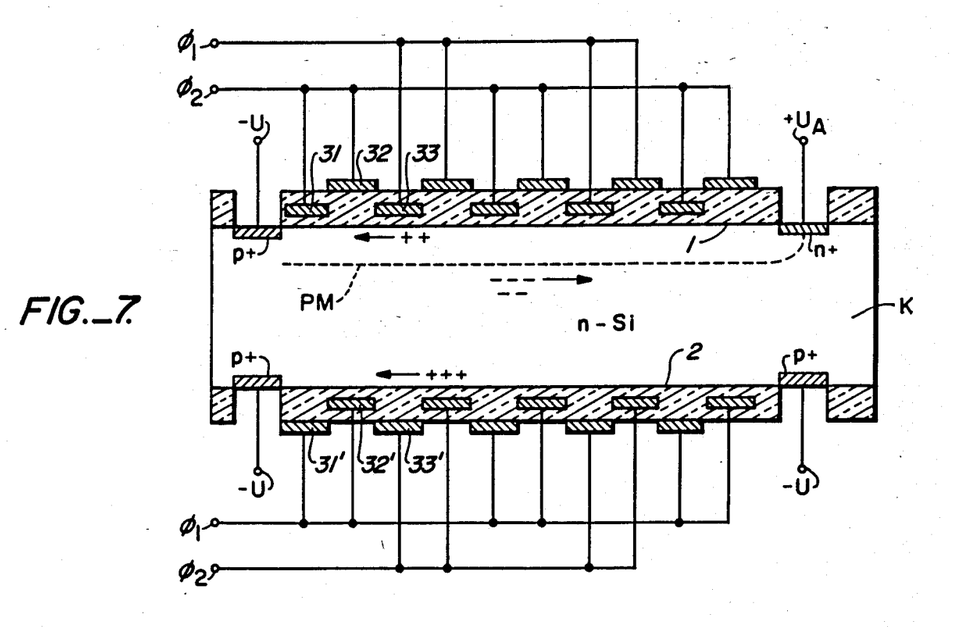
FIG. 7 is a cross-section view through a semiconductor body in accord with a second embodiment of the invention used as a CCD.

FIG. 7 shows another embodiment of the invention, in which there is a minority carrier CCD structure on the main surface 2, which is built up in the same way as the structure on main surface 1 explained in conjunction with FIG. 6. Only electrode n+ for the collection of the majority carriers is missing, because the majority carriers are collected on the main surface 1. The second electrode p+ leads to a certain repulsion action which aids the flow of majority carriers to the collector electrode for the majority carriers, and the course of the potential minimum is "smoothed".

This embodiment permits the recording of three charge images whereof two correspond to the two charge images of the embodiment according to FIG. 6 and the third charge image is brought about by the minority carriers collected under the main surface 2 and formed in the region between the main surface 2 and the PM.

Once again when irradiating with light with wavelengths from the infrared to the visible range, the third charge image gives the pure "infrared image" because the collected minority carriers are exclusively produced by light with wavelengths in the infrared range.

In the embodiment shown in FIGS. 6 and 7, the different features are combined, only a part thereof being necessary for realizing the basic concept according to the invention. It is also possible to partly or completely replace the MIS electrodes with pn-junctions.

Figure 8:
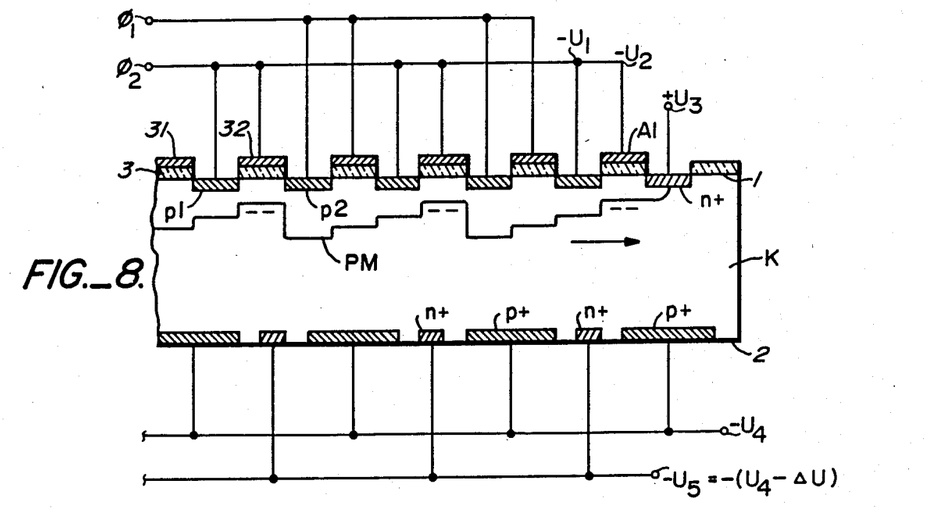
FIG. 8 is a cross-section view through semiconductor body in accord with an embodiment of the invention used as a majority carrier CCD.

FIG. 8 shos such a CCD in which some of the MIS electrodes are replaced by pn-junctions. In the case of this embodiment, main surface 1 alternately carries p-regions p1, p2 and MOS structures 31, 32, etc. The MOS structures comprise aluminum onto layers A1 evaporated a $SiO_2$-oxide layer 3. The structure of main surface 2 corresponds to the electrode arrangement in the embodiment illustrated by FIG. 7.

In the case of the CCD according to FIG. 8, only the majority carriers collected in the potential minimum PM are displaced, whereas the signals of the minority carriers which drift to the p-doped regions are read out in some different way (e.g., via the structure on main surface 2). Moreover, in the case of such a CCD, it is possible by suitable doping to "build in" a preferred direction for such movement.

Figure 9:
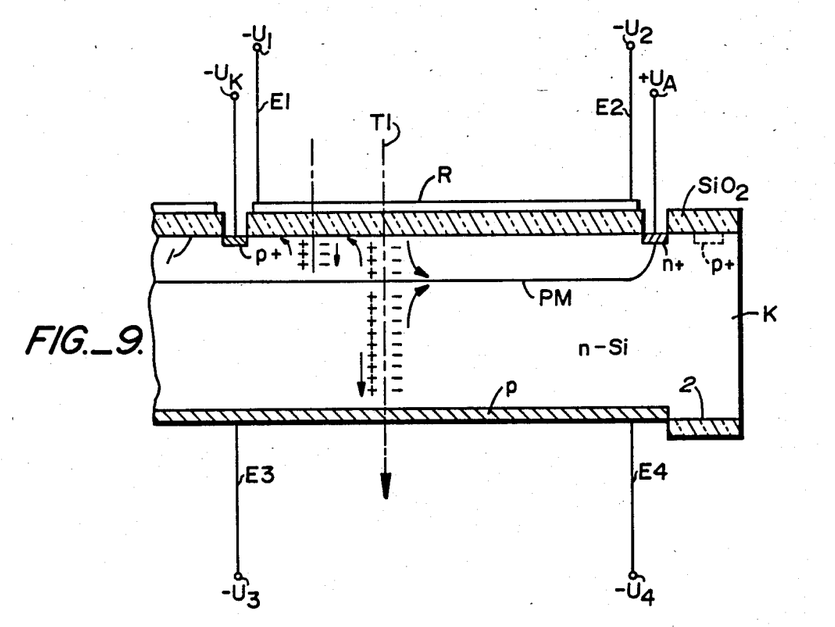
FIG. 9 is a cross-section view through a semiconductor body in accord with a first embodiment of the invention used as a continuous CCD.

FIG. 9 shows another embodiment combining the various advantages of the aforementioned embodiments.

On the main surface 1 of semiconductor body k is an oxide layer $SiO_2$, to which is applied a resistance layer R. The resistance layer R is contacted with two electroes E1 and E2. In the main surface 1, there is also a p+ region for collecting the minority carriers and a n+ region for collecting the majority carriers. In the main surface 2, there is a high-impedance region p (i.e., a resistance layer) contacted with electrodes E3 and E4.

If voltages U1 to U4 are applied to electrodes E1 to E4 /U1/>/U2/, /U3/>/U4/, and the voltages −UK and +UA are applied to the p+ and n+ regions, then a continuous CCD is obtained for the majority carriers as well as the minority carriers formed between the main surface 1 and the PM.

Through a p+ layer arranged adjacent to the n+ region in the main surface 1, it is possible to reduce the capacitance of the electrode formed by the n+ region.

This element leads to a number of advantages.

First, a position determination of incident particles is possible both from the minority and from the majority carrier charge image.

Secondly, a rapid trigger signal is available on the main surface 2 and the ratio of the signals tapped on electrodes E3 and E4 can also be used for a rough position determination of the incident radiation.

Thirdly, the readout electrodes have a low capacity both for majority carriers and minority carriers, and for the majority carrier signal this can be further reduced by an additional p+ layer, while a low leakage current also flows.

Fourthly, through the continuous displacement of the majority carriers and the minority carriers, there is no need to erase full cells.

Finally, the element is usable as a dE/E detector and makes it possible to distinguish between shallow and deep penetrating radiation.

Figure 10:
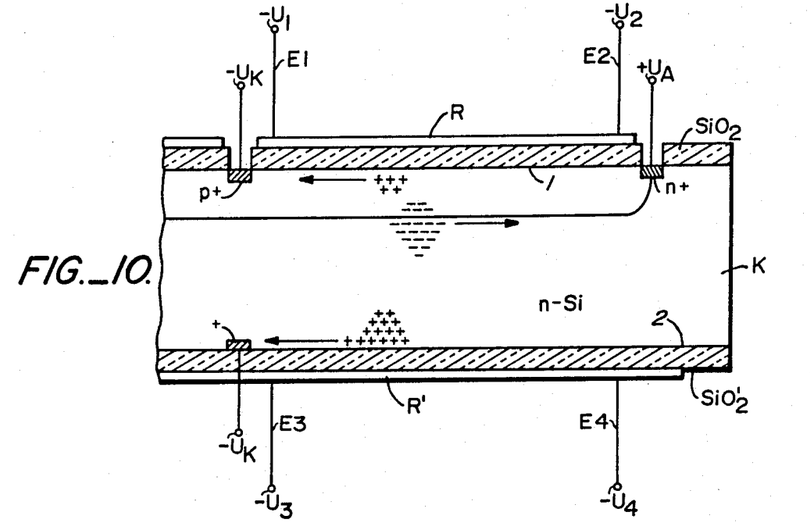
FIG. 10 is a cross-section view through a semiconductor body in accord with a second embodiment of the invention used as a continuous CCD.

FIG. 10 shows a variant of the embodiment shown in FIG. 9 in which a minority carrier CCD structure is provided on main surface 2. There is once again a resistance layer R' on the insulating layer $SiO_2'$, which is contacted by two electrodes E3 and E4. And once again the voltages U1-U4, which can also satisfy the relationship /U1/>/U2/, /U3/>/U4/. In the main surface 2, there is also a region p+' to which is applied the voltage −UK and in which are collected the minority carriers formed beteen main surface 2 and the PM.

The embodiment shown in FIG. 10, like the CCD of FIG. 7, supplies three charge images which give different informations if the element is used as a detector for visible light and infrared light.

Figure 11:
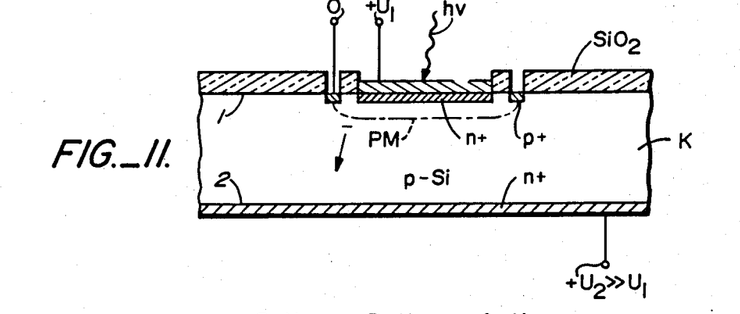
FIG. 11 is a cross-section view through a single photon avalanche diode constructed according to the invention.

FIG. 11 shows as a further embodiment a single photon avalanche diode constructed in accordance with the principle of the invention. The diode once again has a semiconductor body k, which in the represented embodiment comprises p-doped silicon. Main surface 1 is provided a silicon dioxide $SiO_2$ insulating layer in which there is an ITO window. Below the ITO window in main surface 1 there is a n+ region which is surrounded by a p-doped depletion region p+. There is a large-area, low-impedance n+ region on the rear side. The voltages shown in FIG. 11 are applied to the individual regions and for these $U_2 > U_1$. On the basis of this relationship and suitable doping profiles, the potential minimum PM is close to the main surface 1. The potential minimum shields the electrons, which in this case are the minority carriers, from most of the semiconductor body, so that they cannot release any undesired avalanche.

Figure 12:
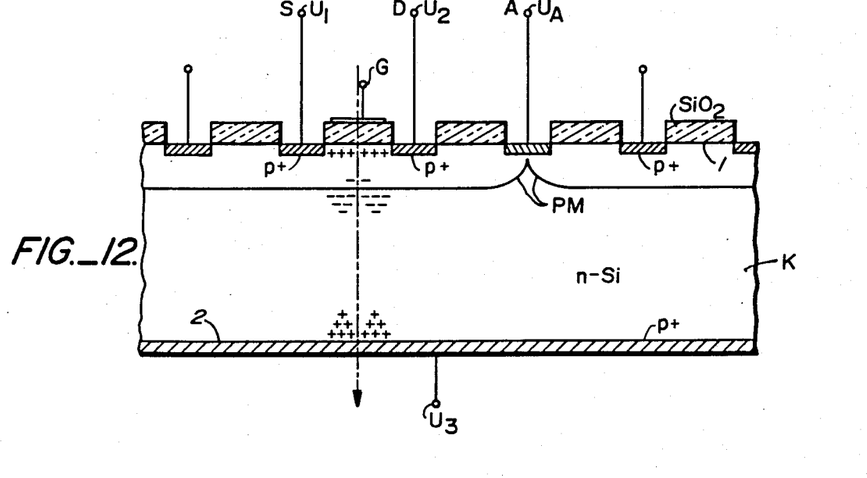
FIG. 12 is a cross-section view through a semiconductor body in accord with a first embodiment of a semiconductor element according to the invention with integrated electronic structures.

FIG. 12 shows a detector with integrated field effect transistors, using the same references for elements identified in the previous drawings. Body k is once again made from n-doped silicon. The elements S, D and G are the source, drain and gate of the field effect transistor. Once again a potential minimum PM is produced in the semiconductor body by the voltage $U_1$, $U_2$ etc. applied to the p+ region and the voltage $U_3$ applied to the main surface 2. The electrons collected in the potential minimum modify the surface potential in the channel under the FET gate G, with the voltage $U_1$ applied to the source and the voltage $U_2$ applied to the drain thereby controlling the drain current $I_D$. By applying a positive voltate $U_1$ to the n+ region A, it is possible to collect the majority carriers.

The semiconductor arrangement shown in FIG. 12, in which the charges produced or collected under gate G can be measured in a non-destructive manner, constitutes only one of the many possibilities for semiconductor arrangements "with built-in signal processing". For example, the coupling of the signal by potential displacement to the gate of a FET can also be used with a semiconductor arrangement operated as drift chamber.

An arrangement in which the semiconductor body between the potential minimum and the main surface 2 is not necessarily used as a radiation detector can advantageously be used as a substitute for an epitaxial layer. Semiconductor elements, such as transistors, which are incorporated into the main surface 1 much as in FIG. 12, are "isolated" from the remaining semiconductor body by the potential minimum because the majority carriers are collected in the potential minimum and the minority carriers, through the potential minimum fo the majority carriers which represents a potential maximum for the minority carriers flow out from the region between the potential maximum and main surface 2 to the main surface 2. The incorporated semiconductor elements, behave in much the same way as elements incorporated into an epitaxial layer. Thus, they have the same advantages as such elements, (e.g., high speed of signal processing due to small capacities).

Figure 13A:
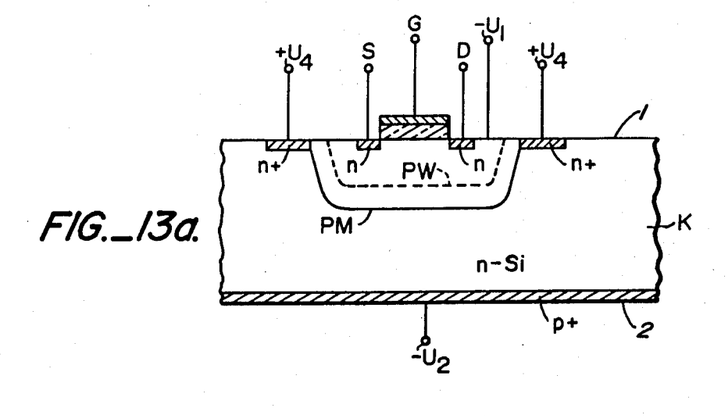
FIGS. 13a to 13c are cross-section views through semiconductor bodies in accord with a second embodiment of the invention with integrated electronic structures.
Figure 13B:
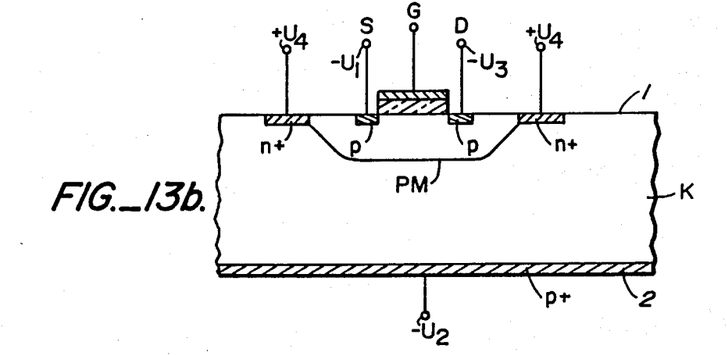
Figure 13C:
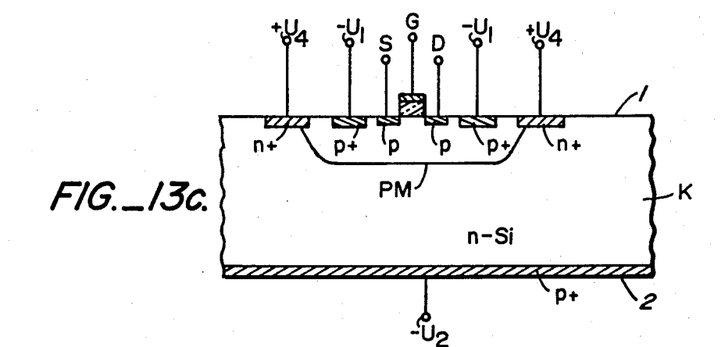

Three insulation or isolation possibilities are shown in FIGS. 13a to c.

In all the embodiments shown in FIG. 13a to c, body k is formed from n-doped silicon. In main surface 2, there is a low-impedance region p+ to which, as has been described several times hereinbefore, is applied a voltage −$U_2$, which together with a voltage −$U_1$ applied to an electrode in main surface 1 produces the potential minimum PM for the majority carriers, (i.e., the electrons in the represented embodiments). Moreover, in the embodiment according to FIG. 13a, there is a p-doped tub pW in main surface 1. This tub surrounds an annular region n+, to which is applied a voltage $U_4$ for the collection of the majority carriers collected in the potential minimum PM.

A complementary NMOS field effect transistor, important for CMOS circuits, is shown in the p-tub pW in FIG. 13a. In a known manner, the FET has a n-doped source S and n-doped drain D between which gate 6 is arranged on an insulating layer. As tub pW is electrically "insulated" from the body k by the potential minimum PM for the majority carriers, which is a potential maximum for the minority carriers, both the majority carriers which are collected in the potential minimum PM and the minority carriers from the main part of body k are kept away from the tub and vice versa. Due to this electrical insulation of the tub, undesired parasitic transistors and, particularly, parasitic thyristors which are prejudicial to the CMOS circuits are avoided. Therefore the circuits can be made secure against the latch-up effect.

FIGS. 13b and 13c show the "insulating possibility" of a PMOS field effect transistor in a n-doped silicon substrate k through potential minimum PM, which in th embodiment shown in FIG. 13b is produced by the drain and source electrodes D, S respectively subject to the action of the negative voltages U3 and U1. This function is assumed in FIG. 13c by the p+ regions subject to the action of voltage −U1, between which is incorporated the transistor.

Obviously other embodiments and combinations of the described embodiments are possible.

Non-limitative embodiments have been described hereinbefore and obviously numerous variants are possible within the general inventive concept. For example, the n and p-doped regions can be interchanged or alternatively use can be made of a cylinder geometry. It is also possible to produce several potential minima in semiconductors with several alternating p, n, p-doped regions.

Moreover, the path of the potential minimum, which is dependent on the semiconductor body doping as well as the voltage, can be used for determining doping differences (e.g., changes to the resistance and/or doping profile). It is also possible to investigate effects such as recombination, trapping, or the life of charge carriers. The position of the potential minimum can, for example, be determined from the ratio of the dark currents to the minority carriers.

We claim:

1. Semiconductor element comprising:
   a basic region;
   biasing means for applying a bias to at least one limiting surface of the basic region which completely depletes the basic region of majority carriers and produces a potential minimum in the basic region for the majority carriers in which the majority carriers are collected and moved;
   majority sensor means for sensing a characteristic of majority carriers; and
   first minority sensor means, operable simultaneously with said majority sensor means for sensing at least one of the following: the quantity, movement direction and speed of the minority carriers controlled by the path of the potential minimum on at least one side of the potential minimum.

2. Semiconductor element according to claim 1, wherein the basic region includes a semiconductor body of a first conductivity type, and electrode arrangements on main surfaces of the body for the application of bias voltages.

3. Semiconductor element according to claim 2, wherein the doping of the basic region is varied in a clearly defined manner in the area of at least one main surface for setting the course of the potential minimum.

4. Semiconductor element according to claim 2, wherein at least a part of the electrode arrangement on at least one of the main surfaces includes an insulating layer, to which is applied a conductive layer with a defined surface resistance.

5. Semiconductor element according to claim 4, wherein the conductive layer is a resistance layer.

6. Semiconductor element according to claim 4, wherein the conductive layer is of a low impedance.

7. A semiconductor element according to claim 4, including means for operating said semiconductor element as a continuous charge-coupled device.

8. Semiconductor element according to claim 2, wherein at least part of the electrode arrangement on at least one of the two main surfaces includes a depletion layer with a clearly defined surface resistance.

9. Semiconductor element according to claim 8, wherein the surface resistance of said depletion layer is of a low impedance.

10. Semiconductor element according to claim 8, wherein at least one region of the second conductivity type forms the depletion layer together with the basic region.

11. Semiconductor element according to claim 2, wherein the electrode arrangement includes a plurality of separate depletion layers.

12. Semiconductor element according to claim 2, wherein individual regions of the electrode arrangement are arranged in matrix or strip-like manner.

13. Semiconductor element according to claim 12, including erase electrodes for collecting the majority carriers between the strip or matrix-like electrodes on one main surface.

14. Semiconductor element according to claim 2, in which an electrode arrangement is provided on one main surfaces, and means is provided on the other main surface for operating said semiconductor element as a minority carrier CCD.

15. Semiconductor element according to claim 2, wherein the electrode arrangement on one main surface includes first strips of a seconductivity type and second strips with the same conductivity type as the semiconductor body at right angles to said first strips in the one main surface.

16. Semiconductor element according to claim 15, wherein the second strips have a higher doping adjacent to the first strips.

17. Semiconductor element according to claim 2, wherein the electrode arrangement includes strip or matrix-like structure on one main surface having alternating RIS structures and depletion layers, which are displaced relative to one another in the direction of the surface normal.

18. Semiconductor element according to claim 2, wherein at least parts of the electrode arrangement have on at least one of the main surfaces "tub-like" regions with a conductivity opposite to that of the semiconductor body.

19. Semiconductor element according to claim 18, wherein the tub-like regions serve as basic bodies for field effect transistors.

20. Semiconductor element according to claim 19, wherein the electrode arrangement for producing the potential minimum for the majority carriers on at least one of the main surfaces simultaneously serves as the source and drain of field effect transistors.

21. A semiconductor element according to claim 18, wherein said semiconductor element forms a basic body for electronic elements as a substitute for an epitaxial layer and other structure of said electronic element are formed with said semiconductor element.

22. A semiconductor element according to claim 18, including means for operating said semiconductor element as a single photon avalanche diode.

23. Semiconductor element according to claim 2, wherein at least one region forming part of an electronic element is inserted between the electrode arrangement on at least one of the two main surfaces.

24. Semiconductor element according to claim 23, wherein the majority and minority carrier signals are coupled to said at least one region.

25. A semiconductor element according to claim 2, including means for operating said semiconductor element as a detector for particles and electromagnetic radiation.

26. A semiconductor element according to claim 2, including means for operating said semiconductor element as a position sensitive radiation detector for the majority carriers of the drift chamber type with internal trigger.

27. A semiconductor element according to claim 2, including means for operating said semiconductor element as a position sensitive detector for minority and majority carriers.

28. A semiconductor element according to claim 2, including means for operating said semiconductor element as a combined detector.

29. A semiconductor element according to claim 2, including means for operating said semiconductor element as a position sensitive CCD detector.

30. A semiconductor element according to claim 2, including means for operating said semiconductor element as a CCD for majority carriers and reading out the signals produced by the minority carriers independently.

31. A semiconductor element according to claim 2, including means for operating said semiconductor element as a CCD for the majority carriers and a CCD for the minority carriers at least between one main surface and the potential minimum for the majority carriers.

32. Semiconductor element according to claim 1, including a second minority sensor means for sensing at least one of the following: movement direction and speed of the minority carriers controlled by the course of the potential minimum on the other side of the potential minimum.

33. Semiconductor element according to claim 32, wherein said first and second minority sensor means includes collector electrodes for the minority carriers on each main surface.

34. Semiconductor element according to claim 1, wherein said first minority sensor means includes at least one collector electrode for the minority carriers.

35. Semiconductor element according to claim 1, wherein said majority sensor means includes at least one collector electrode for the majority carriers.

36. Semiconductor element according to claim 35, wherein the collector electrode for the majority carriers includes an enhancement region of the same conductivity as that of the semiconductor body.

37. Semiconductor element according to claim 36, including a depletion region of opposite conductivity to that of the semiconductor body arranged on the collector electrode for reducing the capacitance of the collector electrode for the majority carriers.

38. Semiconductor element according to claim 1, including several potential minimals present through juxtaposed regions of different doping and/or heterostructures.

39. A semiconductor element according to claim 1, including means for operating said semiconductor element as a radiation detector with built-in electronic signal amplification.

40. Semiconductor element comprising:
a basic region;
majority electrode means for collecting majority carriers;
minority electrode means operable simultaneously with said majority electrode means for collecting minority carriers; and
biasing means for applying a bias to at least one limiting surface of the basic region to completely deplete the basic region of majority carriers and produce a potential minimum which extends at least partially into the interior of the basic region for the majority carriers in which the majority carriers are collected and moved to said majority electrode means;
whereby the path of the potential minimum and the majority carriers collected in the potential minimum controls at least one of the following: the quantity, movement direction and speed of the minority carriers on at least one side of the potential minimum irrespective of the minority carriers on the other side of the potential minimum.

* * * * *